(12) United States Patent
Walther

(10) Patent No.: US 6,686,598 B1
(45) Date of Patent: Feb. 3, 2004

(54) WAFER CLAMPING APPARATUS AND METHOD

(75) Inventor: Steven R. Walther, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 94 days.

(21) Appl. No.: 09/653,505

(22) Filed: Sep. 1, 2000

(51) Int. Cl.⁷ .................................................. H01J 37/20
(52) U.S. Cl. ............................... 250/492.21; 250/443.1
(58) Field of Search ....................... 250/492.21, 443.1; 438/758; 165/185, 80.2; 248/683

(56) References Cited

U.S. PATENT DOCUMENTS

| | | | |
|---|---|---|---|
| 3,197,682 A | | 7/1965 | Klass et al. |
| 3,253,200 A | | 5/1966 | Klass et al. |
| 3,993,509 A | | 11/1976 | McGinty |
| 4,139,051 A | | 2/1979 | Jones et al. |
| 4,184,188 A | | 1/1980 | Briglia |
| 4,282,924 A | | 8/1981 | Faretra |
| 4,384,610 A | * | 5/1983 | Cook et al. ............... 165/185 |
| 4,412,133 A | | 10/1983 | Eckes et al. |
| 4,457,359 A | | 7/1984 | Holden |
| 4,480,284 A | | 10/1984 | Tojo et al. |
| 4,502,094 A | | 2/1985 | Lewin et al. |
| 4,520,421 A | | 5/1985 | Sakitani et al. |
| 4,528,208 A | * | 7/1985 | Hirvonen et al. ........... 118/500 |
| 4,535,835 A | | 8/1985 | Holden |
| 4,554,611 A | | 11/1985 | Lewin |
| 4,607,496 A | | 8/1986 | Nagaura |
| 4,665,463 A | | 5/1987 | Ward et al. |
| 4,724,510 A | | 2/1988 | Wicker et al. |
| 4,832,781 A | | 5/1989 | Mears |
| 4,938,992 A | | 7/1990 | Mears |
| 5,037,189 A | * | 8/1991 | Fujie et al. ............... 359/507 |
| 5,103,367 A | | 4/1992 | Horwitz et al. |
| 5,126,571 A | * | 6/1992 | Sakai ....................... 250/443.1 |
| 5,220,171 A | * | 6/1993 | Hara et al. ................ 250/443.1 |
| 5,345,999 A | | 9/1994 | Hosokawa |
| 5,452,177 A | | 9/1995 | Frutiger |
| 5,631,803 A | | 5/1997 | Cameron et al. |

FOREIGN PATENT DOCUMENTS

| | | |
|---|---|---|
| EP | 0 780 885 A2 | 6/1997 |
| JP | 07 237066 A | 9/1995 |
| JP | 08 064662 A | 3/1996 |

* cited by examiner

Primary Examiner—Jack Berman

(57) ABSTRACT

The invention provides a wafer clamping apparatus and method for use in semiconductor processing. The apparatus includes a clamping component that holds a backside of the wafer to a supporting surface and cools the wafer to prevent overheating. The clamping component is a chemical compound, such as $H_2O$, that covers at least a section of the supporting surface and can adhere the backside of the wafer to the supporting surface. The component undergoes one or more phase-changes (e.g., liquid to solid, solid to liquid, etc.) to facilitate various operations throughout the process. The phase-changes ensure that the wafer may be easily loaded onto and released from the supporting structure at the beginning and end of the process, respectively, while being securely held and cooled during the process. The wafer clamp is suitable for use in a number of semiconductor processes, including ion implantation, and is particularly useful in processes that require wafer cooling such as ion implantation processes that have high implant energies, long implant times, high implant doses, or combinations thereof.

50 Claims, 4 Drawing Sheets

WAFER CLAMPING APPARATUS AND METHOD

FIELD OF THE INVENTION

The invention relates generally to semiconductor processing and, more particularly, to a semiconductor wafer clamping apparatus and method.

BACKGROUND OF THE INVENTION

A number of semiconductor processes may cause unwanted heating of wafers. Such heating may be undesirable because, for example, it can result in uncontrolled diffusion of dopants within the wafer and can degrade patterned photoresist layers. To limit this type of heating, wafers may be cooled during certain semiconductor processes.

In particular, certain ion implantation processes may utilize wafer cooling. Ion implantation is a conventional technique for introducing dopants into semiconductor materials. A desired dopant material is ionized in an ion source and the ions are accelerated to form an ion beam of selected energy which is directed at the surface of the wafer. The ions in the beam penetrate into the bulk semiconductor material to form a region of the desired conductivity. The impingement of the energetic ions upon the wafer can heat the wafer which, in some cases, increases the wafer temperature enough to cause the undesirable effects described above, if the wafer is not cooled. Cooling may be particularly important in ion implantation processes having high implant energies, long implant times, and/or high implant doses.

Wafer cooling may be challenging in vacuum environments, such as those used in ion implantation processes, due to the absence of convection cooling and limited cooling via gas-phase conduction. In some processes, wafers are cooled by cooling a supporting structure to which the wafer is clamped. In these processes, heat is conducted away from the wafer as a result of its contact with the cooled structure. However even when the wafer and supporting structure are highly polished, direct contact between the wafer and supporting structure may only occur in localized areas due to surface roughness on the microscopic level and/or contamination. As a result, conduction in these cases may not be highly efficient.

Conventional clamping techniques for holding a wafer to the supporting structure including mechanical clamping, electrostatic clamping, or centrifugal clamping. In some of these conventional clamping techniques, contamination may be generated as a result of the direct contact between the wafer and the supporting structure. It is generally advantageous to limit such contamination, which can degrade device performance.

Accordingly, a need exists for wafer clamping apparatus which may be used to hold and efficiently cool a wafer during semiconductor processing and, in particular, during ion implantation.

SUMMARY OF THE INVENTION

The invention provides a wafer clamping apparatus and method for use in semiconductor processing. The apparatus includes a clamping component that holds a backside of the wafer to a supporting surface and cools the wafer to prevent overheating. The clamping component is a chemical compound, such as $H_2O$, that covers at least a section of the supporting surface and can adhere the backside of the wafer to the supporting surface. The component undergoes one or more phase-changes (e.g., liquid to solid, solid to liquid, etc.) to facilitate various operations throughout the process. The phase-changes ensure that the wafer may be easily loaded onto and released from the supporting structure at the beginning and end of the process, respectively, while being securely held and cooled during the process. The wafer clamp is suitable for use in a number of semiconductor processes, including ion implantation, and is particularly useful in processes that require wafer cooling such as ion implantation processes that have high implant energies, long implant times, high implant doses, or combinations thereof.

In one aspect, the invention provides a wafer clamping apparatus. The apparatus includes a platen having a supporting surface, and a clamping component that covers at least a section of the supporting surface and undergoes at least one phase-change during a processing cycle to effect the clamping of a wafer to the supporting surface.

In another aspect, the invention provides a wafer clamping apparatus. The apparatus includes a platen having a supporting surface, and a clamping component covering at least a section of the supporting surface. The clamping component is adherable to a backside of a wafer and capable of releasing a backside of a wafer in response to an increase in temperature.

In another aspect, the invention provides a wafer clamping apparatus. The apparatus includes a platen having a supporting surface. The apparatus further includes a clamping component that during a first period of a processing cycle, is a liquid film covering at least a portion of the supporting surface and, during a second period of the processing cycle, is a solid film adherable to a backside of a wafer.

In another aspect, the invention provides a method of clamping a wafer. The method includes providing a clamping component covering at least a section of a supporting surface of a platen, and changing the phase of the clamping component to effect the clamping of a wafer to the supporting surface.

In another aspect, the invention provides a method of clamping a wafer. The method includes providing a solid film on at least a portion of a supporting surface of the platen to adhere a backside of the wafer to the supporting surface. The method further includes heating the solid film to release the backside of the wafer from the supporting surface.

Among other advantages, the clamping apparatus is capable of securely holding a wafer which permits the wafer to be moved as desired during processing. The clamping apparatus also provides highly efficient cooling in vacuum due to the large contact area between the clamping component and the wafer, and the relatively high thermal conductivity of the clamping component. Furthermore, the clamping apparatus may reduce the contamination generated as compared to certain conventional clamping techniques, which involve direct contact between the wafer and the supporting surface, due to the presence of the clamping component between the wafer and the supporting surface.

Other advantages, features, and embodiments will be apparent from the following detailed description when considered in conjunction with the accompanying figures.

DETAILED DESCRIPTION

The invention provides a semiconductor wafer clamping apparatus and method. The apparatus includes a clamping component that holds the wafer to a supporting structure and can conduct heat away from the wafer to limit or prevent unwanted wafer heating. As described further below, the clamping component is a chemical compound that may exist in different phases at different stages during a semiconductor processing cycle to facilitate the operation of the clamping apparatus. For example, the clamping component may be a solid film when holding and cooling the wafer, and the component may be a liquid film or a gas when the wafer is loaded onto or removed from the supporting structure. The clamping apparatus may be used in a number of semiconductor processing systems including ion implantation systems.

Figure 1:
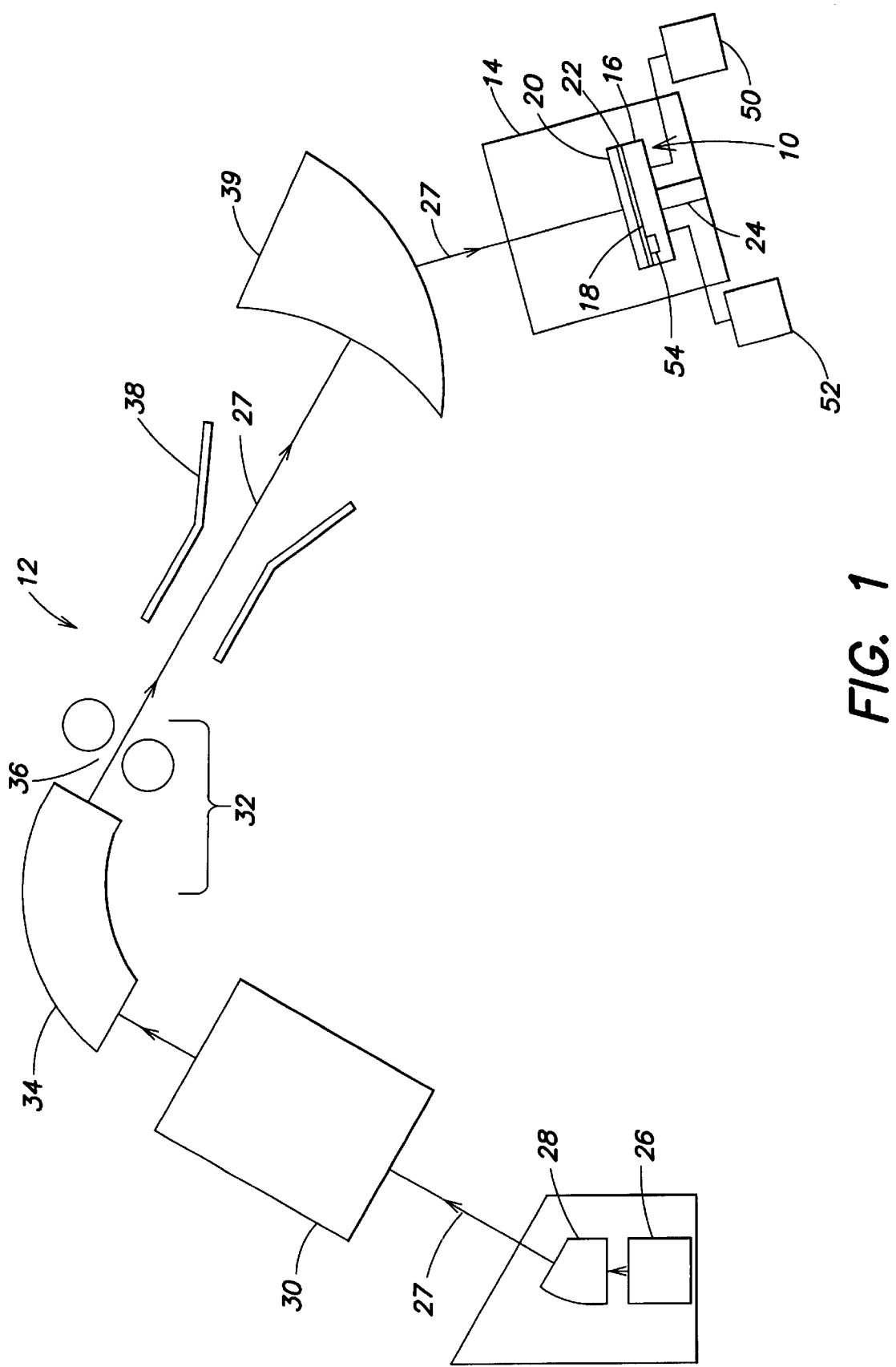
FIG. 1 schematically illustrates the wafer clamping apparatus used in an ion implantation system according to one embodiment of the invention.

FIG. 1 schematically illustrates a wafer clamping apparatus 10 as a part of an ion implantation system 12 according to one embodiment of the present invention. Clamping apparatus 10 is positioned within a vacuum chamber 14 which is typically maintained at a pressure of less than $10^{-5}$ torr. Clamping apparatus 10 includes a platen 16 having a supporting surface 18. As described further below, a semiconductor wafer 20 is held to supporting surface 18 by a clamping component 22 during implantation. Wafer 20 may include any number of deposited layers (e.g., oxide layers, photoresist layers, etc.) or doped regions (e.g., n-regions, p-regions) as known in the art. Platen 16 is attached to a manipulator 24 which may be maneuvered as desired, for example, to move the platen within chamber 14.

Ion implantation system 12 includes an ion source 26 which generates an ion beam 27 and a source filter 28 which removes undesired species from the beam. Downstream from the source filter, the system includes an acceleration/deceleration column 30 which accelerates/decelerates ions in the beam to a desired energy. System 12 further includes a mass analyzer 32 which removes energy and mass contaminants from ion beam 27 through the use of a dipole analyzing magnet 34 and a resolving aperture 36. A scanner 38, which may be an electrostatic scanner, is positioned downstream of the mass analyzer and is designed to scan ion beam 27 across wafer 20 as desired. The system includes an angle corrector magnet 39 to deflect ions in the scanned beam to produce a scanned beam having parallel ion trajectories.

During implantation, ion beam 27 impinges upon wafer 20 to introduce the desired dopant into the semiconductor material. As described further below, platen 16 and clamping component 22 are cooled to dissipate heat generated in wafer 20 from the impingement of ion beam 26 so that the temperature of the wafer remains below a desired value.

Referring to FIGS. 2A–2E, wafer clamping apparatus 10 is schematically shown at different stages throughout an implant cycle of a typical implantation process. As used herein, a processing cycle begins when a wafer is introduced into a processing apparatus (e.g., ion implantation system) and ends when the wafer is removed from the processing apparatus.

Figure 2A:
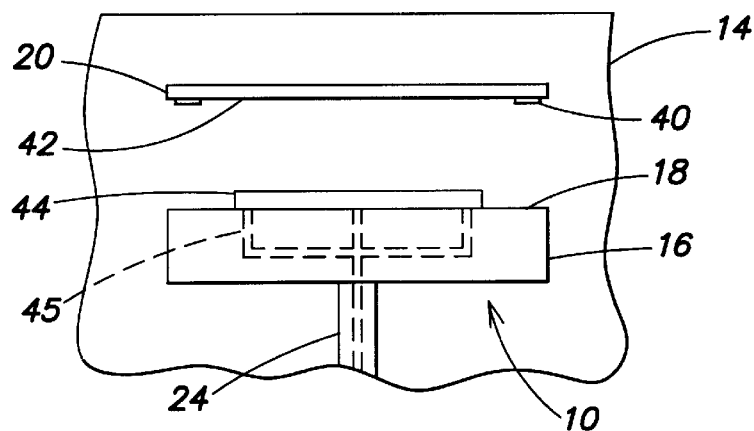
FIG. 2A is a cross-section of the wafer clamping apparatus including a liquid film on a supporting surface of a platen prior to loading the wafer onto a supporting surface of the apparatus.

FIG. 2A shows clamping apparatus 10 at the beginning of the implantation cycle prior to wafer 20 being loaded onto supporting surface 18. In the illustrative embodiment, arms 40 of a wafer handling system (not shown) support the periphery of a backside 42 of wafer 20 prior to loading the wafer onto clamping apparatus 10. The clamping component is present as a liquid film 44 that covers a section of supporting surface 18 and, generally, wets the supporting surface in the areas of contact. Liquid film 44 may be formed by delivering the component to supporting surface 18 via a plurality of conduits 45 which are connected to a clamping component source 50 (FIG. 1). The extent which liquid film 44 covers surface 18 may vary and can be a function of a variety of factors such as wafer size, the amount of cooling required, and the degree of expansion/contraction of the film during subsequent steps, as described further below.

In some embodiments, a small amount of liquid film 44 may evaporate prior to the wafer being mounted on supporting surface 18 due to the vacuum environment within chamber 14. The amount of evaporation may be controlled so the vacuum is not adversely effected, for example, by using small volumes of clamping component 22 and by decreasing wafer loading times. If required, source may replenish liquid film 44 by delivering additional amounts of the clamping component to supporting surface 18. In some embodiments, the liquid film may be delivered to the supporting surface after wafer is loaded upon the surface which may decrease the amount of evaporation.

Figure 2B:
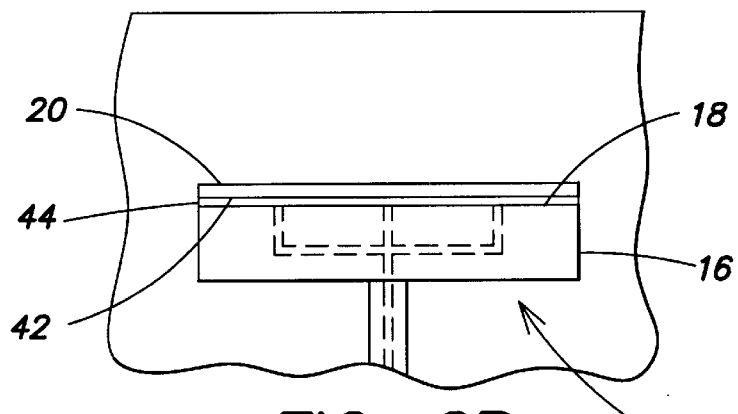
FIG. 2B is a cross-section of the wafer clamping apparatus after the wafer has been loaded on the supporting surface prior to ion implantation.

FIG. 2B shows clamping apparatus 10 after wafer 20 has been loaded onto the clamping apparatus. In some cases during loading, the wafer may be placed by arms 40 on a plurality of pins 56 (FIG. 3) that extend upward from supporting surface 18, afterwhich the arms are withdrawn from the chamber. The pins may be retracted within the platen to lower the wafer onto the supporting surface. Once loaded, wafer 20 rests upon liquid film 44, thus preventing direct contact between the wafer and supporting surface 18. The lack of direct contact between wafer 20 and supporting surface 18 inhibits the generation of contamination that otherwise might be generated when a wafer contacts a hard surface. Less contamination can reduce defects which otherwise may impair device performance. Due to the weight of wafer 20, liquid film 44 may be somewhat compressed, which reduces its thickness and increases the area it covers on supporting surface 18 relative to the embodiment illustrated in FIG. 2A. Liquid film 44 wets backside surface 42 of the wafer, thereby creating a large contact area between the component and the wafer.

Figure 2C:
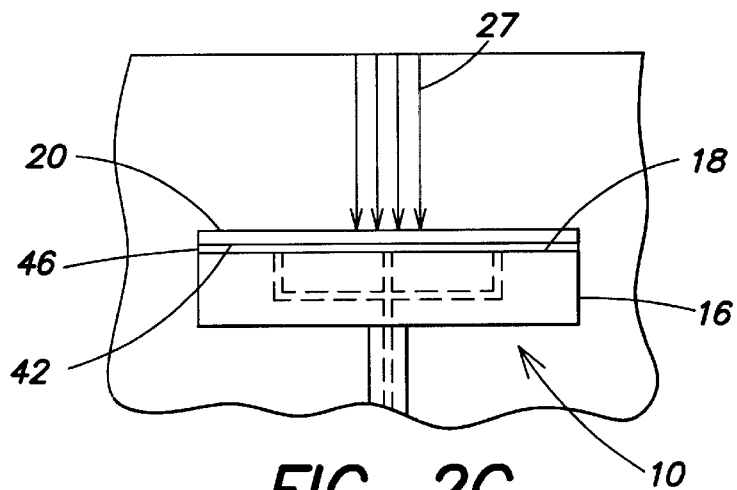
FIG. 2C is a cross-section of the wafer clamping apparatus during ion implantation after the liquid film has undergone a phase-change to a solid film and while the wafer is being cooled.

FIG. 2C schematically shows wafer clamping apparatus 10 during ion implantation after liquid film 44 (FIGS. 2A and 2B) has undergone a phase-change to form a solid film 46. Solid film 46 is formed by cooling platen 16 to a temperature below the freezing point of the clamping component. The solid film, for example, may have a thickness of between about 1 micron and about 10 microns. The platen may be cooled by circulating a chilled fluid through channels 47 (FIG. 3) within the platen. The chilled fluid may be supplied by an external cooling source 52 (FIG. 1).

Solid film 46 has a high degree of contact with both supporting surface 18 of platen 16 and backside surface 42 of wafer 20 as a result of liquid film 44 wetting these respective surfaces. The large contact area enhances the thermal conductance between the wafer, the solid film, and the platen. The heat generated by the impingement of ion beam 27 upon wafer 20 may, thus, effectively be conducted away from the wafer to solid film 46 and platen 16. The temperature of platen 16 is controlled to maintain the clamping component as a solid film and to maintain wafer 20 below a desired temperature during implantation. The desired wafer temperature depends upon the requirements of a particular process but, generally, is below a temperature at which photoresist begins to degrade. In some embodiments, the temperature of the wafer is maintained less than 100° C., in some embodiments less than 75° C., in some embodiments less than 50° C., and in some embodiments less than 25° C.

Figure 2D:
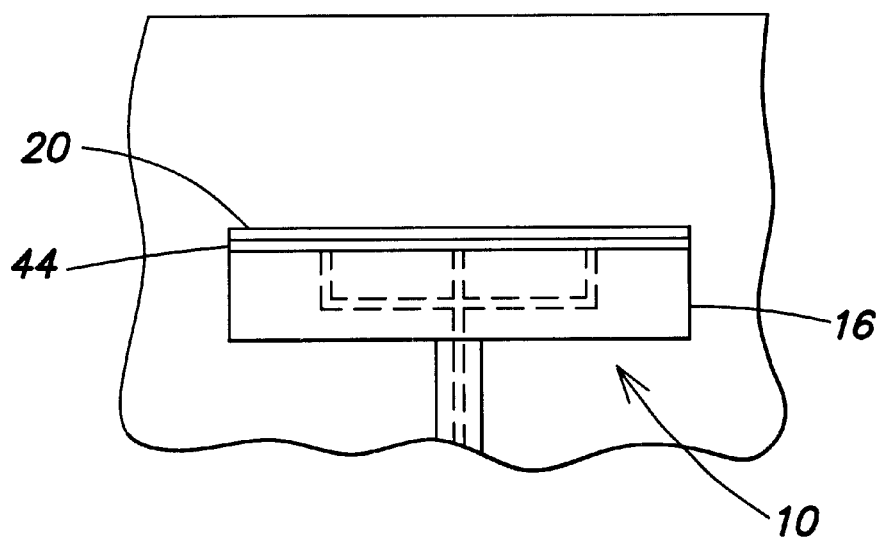
FIG. 2D is a cross-section of the wafer cooling apparatus after ion implantation and after the solid film has undergone a phase-change to a liquid film.

FIG. 2D schematically shows the wafer clamping apparatus after implantation and after solid film 46 (FIG. 2C) has been melted to re-form liquid film 44. In certain embodiments, solid film 46 is melted by heat transferred from wafer 20. In these embodiments, the wafer may be heated sufficiently to cause solid film 46 to melt, but not enough to cause the negative effects associated with wafer heating such as the degradation of photoresist. In some of these embodiments, the amount of cooling provided by platen 16 may be reduced or eliminated during a latter portion of implantation which may result in the heating of the wafer. In other embodiments, platen 16 may be heated by an external source, for example, by circulating a heated fluid through internal channels 47 (FIG. 3) within the platen. In other embodiments, a heat source other than the platen may be used to melt solid film 46. In some cases, a combination of the aforementioned techniques may be utilized to melt the solid film to form liquid film 44.

As illustrated, liquid film 44 covers at least a section of supporting surface 18 and separates wafer 20 from the supporting surface. Wafer 20 may be easily removed from liquid film 44, for example, by a wafer handling system. To facilitate wafer removal, pins 56 (FIG. 3) may extend upwards pushing the wafer a short distance away from the supporting surface to permit arms 40 (FIG. 2A) of a wafer handling system, for example, to support backside 42 of the wafer and remove the wafer from chamber 14.

Figure 2E:
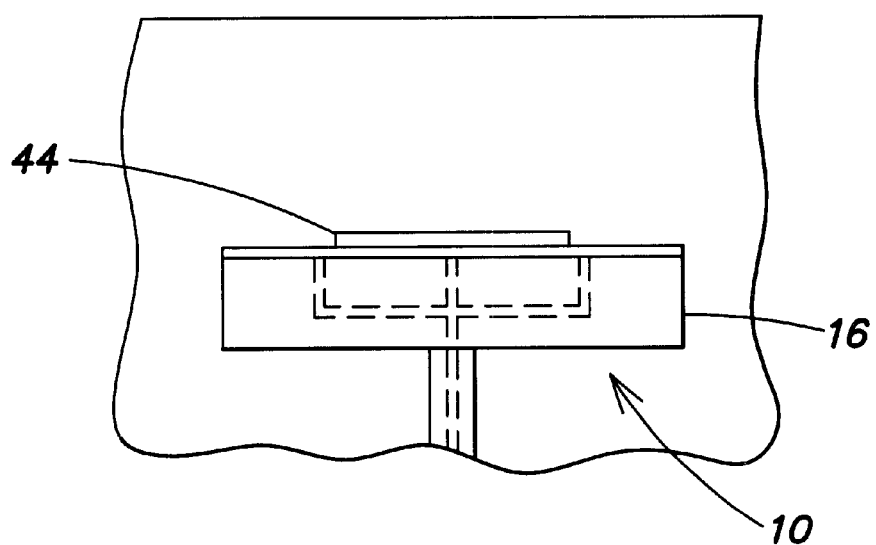
FIG. 2E is a cross-section of the wafer clamping apparatus after the wafer has been removed from the apparatus.

FIG. 2E shows wafer clamping apparatus 10 after wafer 20 has been removed from supporting surface 18. In the illustrative embodiment, some of liquid film 44 has evaporated into the vacuum leaving a residual amount of the liquid film on supporting surface 18. The amount of liquid film that evaporates depends upon the particular clamping component, as well as the temperature within the chamber. In some embodiments, essentially all of the liquid film evaporates prior to loading another wafer, while in other embodiments essentially none of the liquid film evaporates. The evaporation of liquid film 44 generally does not sacrifice the vacuum conditions in chamber 14 because of the small volumes of the component used, as described further below.

The process cycle illustrated in FIGS. 2A–2E may be repeated to process additional wafers.

It should be understood that the process shown in FIGS. 2A–2E is provided as one illustrative embodiment of the invention and that the wafer clamping apparatus and method may have a number of variations. For example, in some embodiments, the clamping component may be delivered to supporting surface through conduits 45 in a gaseous state. In these embodiments, the gas may condense on backside 42 of the wafer or on supporting surface 18 to form liquid film 44 which may be frozen to clamp and cool the wafer as described above. Alternatively, in some of these embodiments, the gas may directly freeze on the backside of the wafer to form a solid film without going through the liquid phase. In some embodiments, solid film 46 may be changed into a gas to release the wafer from wafer clamping apparatus 10.

In some embodiments, wafer 20 may be released from the wafer clamping apparatus by vibrating the wafer using a mechanical vibrating device 54, for example, an ultrasonic transducer (FIG. 1) such as a piezoelectric crystal. In some cases, vibrating device 54 may be mounted within a cavity in platen 16 so that device 54 defines a portion of the supporting surface in contact with solid film 46. Vibrating device 54 may be attached to a power source (not shown) external of the chamber which can vibrate the device, in some cases at ultrasonic frequencies, to break the adhesive bond between backside 42 of the wafer and solid film 46. In some cases, mechanical vibration can provide a quick release of the wafer. In these cases, the solid film remaining upon the supporting surface may subsequently be converted into a liquid film which wets backside surface 42 by heating the platen. In other cases, a liquid film may be formed using the heat capacity of a room temperature or a pre-heated wafer that is placed upon the solid film to provide a temperature greater than the melting point of the solid film, but lower than a temperature which causes undesirable effects. In these cases, solid film 46 is re-formed by cooling the platen, as described above.

In some embodiments, the application or reduction of pressure may be used to cause the phase-change of clamping component 22. For example, pressure may be increased to cause the phase-change from liquid film 44 to solid film 46 or may be decreased to cause the phase-change from solid film 46 to liquid film 44. In some embodiments, the phase-change of the clamping component may be caused by a combination of a change in pressure and a change in temperature.

It is to be understood that wafer clamping apparatus 10 may be used in any type of semiconductor processing equipment wherein a wafer is clamped to a supporting structure. Though not required, wafer clamping apparatus 10 is preferably used in processes that utilize wafer cooling. The clamping apparatus is particularly useful in ion implantation processes which utilize wafer cooling. Such processes include ion implants that have high energies (e.g., greater than 10 kV), long implant times (e.g., greater than 1 minute), high doses (greater than $10^{16}$ atoms/cm$^3$) or combinations thereof. Clamping apparatus 10 may be used in ion implantation systems having different configurations from the embodiment illustrated in the figures, including batch implantation systems in which multiple wafers are mounted on a rotatable disk.

A variety of compounds may be suitable for use as clamping component 22. Preferably, the compound is compatible with semiconductor materials and processes. The compound is generally capable of undergoing one or more of the phase-changes described above under temperature and pressure conditions which are achievable during a process cycle. In some embodiments, the compound is a liquid or a gas at the conditions within the chamber during wafer loading (e.g., T≈20° C. and P<$10^{-5}$ Torr) and may be relatively easily and quickly solidified to form the solid film. For example, the compound may have a freezing temperature between about 10° C. and about −10° C. at the pressures within the chamber.

In certain preferred embodiments, water ($H_2O$) or deionized water may be used as the component. In these embodiments, water is generally delivered to supporting surface 18 in a liquid state, as described above. In some cases, water may be mixed with one or more additional compounds, for example, to adjust the freezing temperature. In other embodiments, carbon dioxide ($CO_2$) may be used as the component. Generally, carbon dioxide is delivered to supporting surface 18 as a gas and may be directly solidified on the backside of wafer 20 to form solid film 46. Other suitable examples of the component include gallium, carbon subsulfide ($C_3S_2$), and hydroxyl amine ($NH_2OH$). However, it should be understood that the invention is not limited to any of the specific compounds disclosed herein.

The compound used as the clamping component should have a thermal conductivity in the solid state great enough to adequately transfer heat away from wafer 20 so that the wafer does not overheat. In some cases, the compound in the solid state has a thermal conductivity of at least 1 mW/cm-K. All of the exemplary compounds listed herein have a sufficient thermal conductivity to function as the component. For example, $H_2O$ in the solid state has a thermal conductivity of about 6 mW/cm-K.

In some embodiments, it is desirable to minimize the volume of component 22 used. Smaller component volumes lower the required heating/cooling times and heating/cooling amounts for the various phase-changes that occur throughout the process. Smaller component volumes also facilitate preservation of the vacuum conditions of the chamber which otherwise may be sacrificed if too much of the component evaporates. In many embodiments, backside surface 42 of the wafer and/or supporting surface 18 of platen 16 are not completely covered by the clamping component in the solid state to sufficiently hold and cool the wafer. For example, selected contact regions may be located at different positions on supporting surface 18 which adhere the wafer to the supporting surface. The positions and extent of the contact regions may be selected to balance the holding force and heat transfer with the volume of the component. The overall area of contact between the clamping component, in the solid state, and the wafer, in some cases, may be less than 75% of the total surface area of the wafer, in other cases less than 50% of the total surface area of the wafer, and in some cases less than 25% of the total surface area of the wafer. It should be understood that, in some embodiments, the component covers the entire backside surface 42 of the wafer and/or supporting surface 18.

The wafer clamping apparatus may utilize any supporting structure, which is herein defined as a platen, known in the art to support wafers during a semiconductor process. In the illustrative embodiments, platen 16 is a plate member having a flat supporting surface 18 and a circular cross-section. Platen 16 generally has a diameter equal to, slightly greater than, or slightly less than wafer 20 to provide adequate support. Platens are typically made of a thermally conductive material such as a metal, including stainless steel or aluminum.

Figure 3:
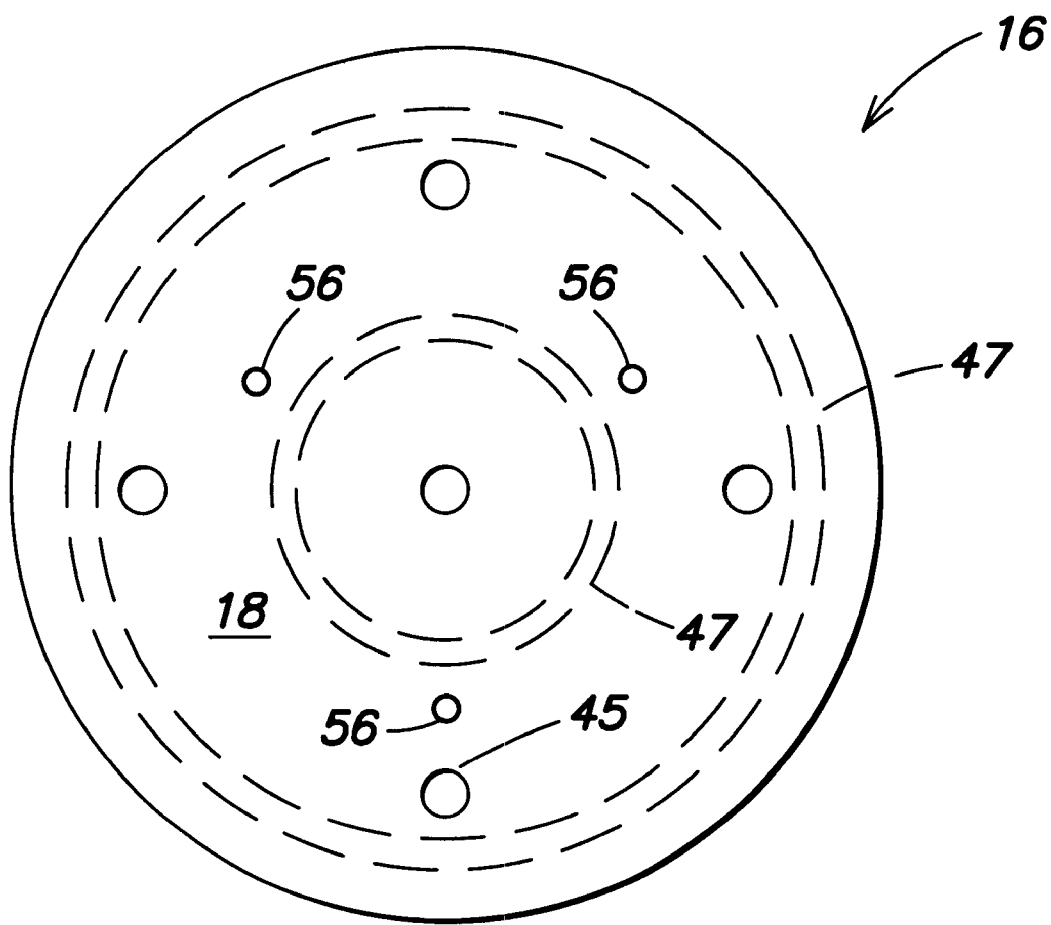
FIG. 3 is a top view of a platen of the wafer clamping apparatus according to one embodiment of the invention.

FIG. 3 shows a top view of platen 16 including one illustrative arrangement of conduits 45 through which component 22 is delivered to supporting surface 18, channels 47 through which chilled fluid is circulated to cool the platen, and pins 56 which are utilized during loading and unloading.

It should be understood that other platen configurations are possible including platens having different conduit, channel, and pin arrangements. For example, in some embodiments, the platen may be a porous material (e.g., a porous metal) or may include a porous material section to deliver the clamping component to the supporting surface and/or to circulate chilled fluid.

Those skilled in the art would readily appreciate that all parameters listed herein are meant to be exemplary and that the actual parameters would depend upon the specific application for which the clamping apparatus and method of the invention are used. It is, therefore, to be understood that the foregoing embodiments are presented by way of example only and that, within the scope of the appended claims and equivalents thereto the invention may be practiced otherwise than as specifically described.

What is claimed is:

1. A wafer clamping apparatus comprising:
   a platen having a supporting surface that is disposed in a vacuum environment; and
   a device for delivering a clamping and cooling component that covers at least a section of the supporting surface and undergoes at least one phase-change during a processing cycle to effect the clamping and cooling of a wafer to the supporting surface.

2. The wafer clamping and cooling apparatus of claim 1, wherein the clamping and cooling component comprises a solid film, during a portion of the processing cycle, covering at least a section of the supporting surface.

3. The wafer clamping and cooling apparatus of claim 2, wherein the solid film is adherable to a backside of a wafer.

4. The wafer clamping and cooling apparatus of claim 3, wherein the solid film conducts heat away from a wafer adhered to the solid film during a portion of the processing cycle.

5. The wafer clamping and cooling apparatus of claim 3, wherein the platen is connectable to a cooling source capable of cooling the solid film.

6. The wafer clamping and cooling apparatus of claim 3, wherein the solid film undergoes a phase-change to release a wafer from the supporting surface.

7. The wafer clamping and cooling apparatus of claim 6, wherein the solid film undergoes a phase-change to a liquid.

8. The wafer clamping and cooling apparatus of claim 6, wherein the solid film undergoes a phase-change to a gas.

9. The wafer clamping and cooling apparatus of claim 2, wherein the clamping and cooling component undergoes a phase-change to form the solid film.

10. The wafer clamping and cooling apparatus of claim 9, wherein a liquid film wetting at least a section of the supporting surface undergoes a phase-change to form the solid film.

11. The wafer clamping and cooling apparatus of claim 8, wherein a gas undergoes a phase-change to form the solid film.

12. The wafer clamping and cooling apparatus of claim 3, further comprising a mechanical vibrating device coupled to the platen constructed and arranged to vibrate thereby causing the wafer to release from the solid film.

13. The wafer clamping and cooling apparatus of claim 12, wherein the mechanical vibrating device comprises an ultrasonic transducer disposed within the platen and defining a portion of the supporting surface.

14. The wafer clamping and cooling apparatus of claim 1, wherein the platen includes a plurality of conduits fluidly connecting a source of the clamping and cooling component to the supporting surface.

15. The wafer clamping and cooling apparatus of claim 1, wherein the clamping and cooling component comprises $H_2O$.

16. The wafer clamping and cooling apparatus of claim 1, wherein the clamping and cooling component comprises $CO_2$.

17. The wafer clamping and cooling apparatus of claim 1, wherein the wafer clamping and cooling apparatus is a part of an ion implantation system.

18. A wafer clamping and cooling apparatus comprising:
a platen having a supporting surface that is disposed in a vacuum environment; and
a device for delivering a clamping and cooling component covering at least a section of the supporting surface, the clamping and cooling component being adherable to a backside of a wafer and capable of releasing a backside of a wafer in response to an increase in temperature.

19. The wafer clamping and cooling apparatus of claim 18, wherein the clamping and cooling component comprises a solid film adherable to the backside of the wafer and to the supporting surface during a portion of a processing operation.

20. The wafer clamping and cooling apparatus of claim 18, wherein the solid film changes phase to release the wafer from the supporting surface.

21. The wafer clamping and cooling apparatus of claim 20, wherein the solid film changes to a liquid film to release the wafer.

22. The wafer clamping and cooling apparatus of claim 19, wherein the solid film is formed by cooling a liquid film wetting at least a section of the supporting surface.

23. The wafer clamping and cooling apparatus of claim 22, wherein the platen is connectable to a cooling source capable of cooling the platen to change the liquid film to the solid film.

24. The wafer clamping and cooling apparatus of claim 19, wherein the solid film conducts heat away from the wafer adhered to the solid film during a portion of the processing cycle.

25. The wafer clamping and cooling apparatus of claim 18, wherein the clamping and cooling component comprises $H_2O$.

26. The wafer clamping and cooling apparatus of claim 18, wherein the clamping and cooling component comprises $CO_2$.

27. The wafer clamping and cooling apparatus of claim 18, wherein the wafer clamping and cooling apparatus is a part of an ion implantation system.

28. A wafer clamping and cooling apparatus comprising:
a platen having a supporting surface that is disposed in a vacuum environment; and
a device for delivering a clamping and cooling component that, during a first period of a processing cycle, is a liquid film covering at least a portion of the supporting surface and, during a second period of the processing cycle, is a solid film adherable to a backside of a wafer.

29. The wafer clamping and cooling apparatus of claim 28, wherein, during a third period of the processing operation, the clamping and cooling component is a liquid film capable of releasing a backside of the wafer from the supporting surface.

30. A method of clamping and cooling a wafer comprising:
delivering a clamping and cooling component to cover at least a section of a supporting surface of a platen that is disposed in a vacuum environment; and
changing the phase of the clamping and cooling component to effect the clamping and cooling of a wafer to the supporting surface.

31. The method of claim 30, further comprising holding a wafer to the supporting surface with the clamping and cooling component.

32. The method of claim 31, further comprising cooling the wafer while holding the wafer to the supporting surface.

33. The method of claim 31, wherein changing the phase of the clamping and cooling component releases the wafer from the supporting surface.

34. The method of claim 30, wherein the clamping and cooling component is provided as a solid film that adheres the wafer to the supporting surface.

35. The method of claim 34, further comprising freezing a liquid film to provide the solid film.

36. The method of claim 35, further comprising wetting at least a section of the supporting surface with the liquid film prior to freezing the liquid film.

37. The method of claim 35, further comprising delivering the liquid film to the supporting surface through conduits in the platen.

38. The method of claim 34, further comprising solidifying a gas to provide the solid film.

39. The method of claim 34, further comprising melting the solid film to form a liquid film to release the wafer.

40. The method of claim 34, further comprising mechanically vibrating the solid film to release the wafer.

41. The method of claim 40, comprising ultrasonically vibrating the solid film to release the wafer.

42. The method of claim 40, further comprising melting the solid film to form a liquid film by placing a wafer on the solid film.

43. The method of claim 30, further comprising implanting ions within a region of the wafer.

44. The method of claim 30, wherein the clamping and cooling component comprises $H_2O$.

45. The method of claim 30, wherein the clamping and cooling component comprises $CO_2$.

46. A method of clamping, cooling and releasing a wafer comprising:
delivering a liquid film during a first period of a processing cycle,
providing a solid film during a second period of a processing cycle on at least a portion of a supporting surface of the platen that is disposed in a vacuum environment to adhere a backside of the wafer to the supporting surface; and
heating the solid film to release the backside of the wafer from the supporting surface.

47. The method of claim 46, comprising changing the solid film to a liquid film to release the backside of the wafer from the supporting surface.

48. The method of claim 46, comprising changing the solid film to a gas to release the backside of the wafer from the supporting surface.

49. The method of claim 46, further comprising implanting ions within a region of the wafer.

50. The method of claim 46, wherein the solid film comprises $H_2O$.

* * * * *